United States Patent
Tanzawa

(10) Patent No.: US 10,090,051 B2
(45) Date of Patent: *Oct. 2, 2018

(54) MEMORY ARRAY WITH POWER-EFFICIENT READ ARCHITECTURE

(71) Applicant: Micron Technology, Inc., Boise, ID (US)

(72) Inventor: Toru Tanzawa, Adachi (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/686,416

(22) Filed: Aug. 25, 2017

(65) Prior Publication Data

US 2017/0352421 A1    Dec. 7, 2017

Related U.S. Application Data

(63) Continuation of application No. 14/961,042, filed on Dec. 7, 2015, now Pat. No. 9,842,652, which is a
(Continued)

(51) Int. Cl.
*G11C 16/26* (2006.01)
*G11C 16/24* (2006.01)
(Continued)

(52) U.S. Cl.
CPC .......... *G11C 16/0483* (2013.01); *G11C 16/24* (2013.01); *G11C 16/26* (2013.01); *G11C 11/5642* (2013.01)

(58) Field of Classification Search
CPC ..... G11C 16/26; G11C 16/24; G11C 11/5642; G11C 16/0483
(Continued)

(56) References Cited

U.S. PATENT DOCUMENTS 5,369,608 A   11/1994  Lim et al.
7,193,898 B2   3/2007  Cernea
(Continued)

FOREIGN PATENT DOCUMENTS

CN   1855304 A   11/2006
CN   101004949 A   7/2007
(Continued)

OTHER PUBLICATIONS

U.S. Appl. No. 14/961,042, filed Dec. 7, 2015, Memory Array With Power-Efficient Read Architecture.
(Continued)

*Primary Examiner* — Ly D Pham
(74) *Attorney, Agent, or Firm* — Schwegman Lundberg & Woessner, P.A.

(57) ABSTRACT

Various embodiments comprise apparatuses and methods including a three-dimensional memory apparatus having upper strings and lower strings. The upper strings can include a first string of memory cells and a second string of memory cells arranged substantially parallel and adjacent to one another. The lower strings can include a third string of memory cells and a fourth string of memory cells arranged substantially parallel and adjacent to one another. The strings can each have a separate sense amplifier coupled thereto. The first and third strings and the second and fourth strings can be configured to be respectively coupled in series with each other during a read operation. Additional apparatuses and methods are described.

18 Claims, 6 Drawing Sheets

Related U.S. Application Data continuation of application No. 14/462,078, filed on Aug. 18, 2014, now Pat. No. 9,208,891, which is a continuation of application No. 13/599,962, filed on Aug. 30, 2012, now Pat. No. 8,811,084.

(51) Int. Cl.
*G11C 5/02* (2006.01)
*G11C 16/04* (2006.01)
*G11C 11/56* (2006.01)

(58) Field of Classification Search
USPC ...... 365/185.17, 185.18, 185.23, 185.05, 63, 365/51
See application file for complete search history.

(56) References Cited

U.S. PATENT DOCUMENTS

| | | | |
|---|---|---|---|
| 7,710,774 B2 | 5/2010 | Chen et al. |
| 7,876,611 B2 | 1/2011 | Dutta et al. |
| 7,920,435 B2 | 4/2011 | Ogawa |
| 8,081,518 B2 | 12/2011 | Tanaka et al. |
| 8,811,084 B2 | 8/2014 | Tanzawa |
| 9,208,891 B2 | 12/2015 | Tanzawa |
| 2002/0036936 A1 | 3/2002 | Park et al. |
| 2007/0019467 A1 | 1/2007 | Toda |
| 2007/0247906 A1 | 10/2007 | Watanabe et al. |
| 2007/0297233 A1 | 12/2007 | Maejima |
| 2008/0181009 A1 | 7/2008 | Arai et al. |
| 2008/0205148 A1 | 8/2008 | Kanda |
| 2008/0225594 A1 | 9/2008 | Lee et al. |
| 2009/0097317 A1 | 4/2009 | Willer et al. |
| 2010/0214838 A1 | 8/2010 | Hishida et al. |
| 2011/0090736 A1 | 4/2011 | Tanaka et al. |
| 2011/0215394 A1 | 9/2011 | Komori et al. |
| 2011/0220987 A1 | 9/2011 | Tanaka et al. |
| 2011/0228606 A1 | 9/2011 | Murotani et al. |
| 2012/0008400 A1 | 1/2012 | Fukuzumi et al. |
| 2012/0008418 A1 | 1/2012 | Huh |
| 2012/0198297 A1 | 8/2012 | Kamigaichi et al. |
| 2013/0070528 A1 | 3/2013 | Maeda |
| 2013/0215684 A1 | 8/2013 | Oh et al. |
| 2014/0063959 A1 | 3/2014 | Tanzawa |
| 2014/0355352 A1 | 12/2014 | Tanzawa |
| 2016/0086666 A1 | 3/2016 | Tanzawa |

FOREIGN PATENT DOCUMENTS

| | | |
|---|---|---|
| CN | 104756192 A | 7/2015 |
| EP | 1720168 A1 | 11/2006 |
| JP | 2009205764 A | 9/2009 |
| TW | 201419448 A | 5/2014 |
| TW | I581370 | 5/2017 |
| WO | WO-2014036304 A1 | 3/2014 |

OTHER PUBLICATIONS

"Chinese Application Serial No. 201380054662.0, Office Action dated Feb. 13, 2017", w/English Translation, 7 pgs.

"Chinese Application Serial No. 201380054662.0, Office Action dated May 20, 2016", w/English Translation, 9 pgs.

"Chinese Application Serial No. 201380054662.0, Office Action dated Sep. 26, 2016", W/English Translation, 19 pgs.

"Chinese Application Serial No. 201380054662.0, Office Action dated Oct. 29, 2015", With English translation, 18 pgs.

"Chinese Application Serial No. 201380054662.0, Response filed Mar. 14, 2016 to Office Action dated Oct. 29, 2015", with English translation of claims, 10 pgs.

"Chinese Application Serial No. 201380054662.0, Response filed Apr. 28, 2017 to Office Action dated Feb. 13, 2017", No English Translation, 4 pgs.

"Chinese Application Serial No. 201380054662.0, Response filed Dec. 12, 2016 to Office Action dated Sep. 26, 2016", w/English Claims, 25 pgs.

"International Application Serial No. PCT/US2013/057362, International Preliminary Report on Patentability dated Nov. 25, 2014", 25 pgs.

"International Application Serial No. PCT/US2013/057362, International Search Report dated Dec. 9, 2013", 3 pgs.

"International Application Serial No. PCT/US2013/057362, Written Opinion dated Dec. 9, 2013", 5 pgs.

"Taiwanese Application Serial No. 102129341, Office Action dated Oct. 4, 2016", No English Tranlation, 4 pgs.

"Taiwanese Application Serial No. 102129341, Response filed Jan. 6, 2017 to Office Action dated Oct. 4, 2016", With English Translation of Claims, 36 pgs.

MEMORY ARRAY WITH POWER-EFFICIENT READ ARCHITECTURE

PRIORITY APPLICATION

This application is a continuation of U.S. application Ser. No. 14/961,042, filed Dec. 7, 2015, which is a continuation of U.S. application Ser. No. 14/462,078, filed Aug. 18, 2014, now issued as U.S. Pat. No. 9,208,891, which is a continuation of U.S. application Ser. No. 13/599,962, filed Aug. 20, 2012, issued as U.S. Pat. No. 8,811,084, all of which are incorporated herein by reference in their entirety.

BACKGROUND

Computers and other electronic systems, for example, digital televisions, digital cameras, and cellular phones, often have one or more memory and other devices to store information. Increasingly, memory and other devices are being reduced in size to achieve a higher density of storage capacity and/or a higher density of functionality. Also, memory devices are being redesigned to achieve higher operational (e.g., read or write) speeds.

DETAILED DESCRIPTION

A number of techniques have been proposed to increase the read speed of various types of memory devices. For example, in a conventional flash memory cell, a read operation is performed with a bit line pre-charged to a predetermined voltage. The pre-charged bit line is then floated so only a pre-charge current is needed. However, only alternative bit lines (e.g., even and odd bit lines alternately connected to every other cell along a word line) are read at a time, since two alternate bitlines are multiplexed into a single sense amplifier.

In some cases, an All-Bit-Line (ABL) read operation has been proposed to increase the parallelism of read operations within NAND flash memory by doubling the number of bit lines, and consequently the number of bits, that can be read simultaneously. Thus, the ABL technique can sometimes double the bandwidth during read, program, and verify operations of a memory device. However, even though the number of accessible bit lines is doubled, the ABL technique requires more power during operation of the memory device. For example, in the ABL technique, direct current (DC) is forced to flow constantly through all memory cells in a string during a read operation, with commensurately higher power requirements than conventional techniques.

The disclosed subject matter proposes various memory device structures that increases the number of data lines (e.g., bit lines) that can be read concurrently by providing a data line and an associated sense amplifier for each string of memory cells. However, the current used by the memory structure may be reduced by a factor of two over standard ABL techniques.

The description that follows includes illustrative apparatuses (circuitry, devices, structures, systems, and the like) and methods (e.g., processes, protocols, sequences, techniques, and technologies) that embody the subject matter. In the following description, for purposes of explanation, numerous specific details are set forth in order to provide an understanding of various embodiments of the subject matter. After reading this disclosure however, it will be evident to person of ordinary skill in the art that various embodiments of the subject matter may be practiced without these specific details. Further, well-known apparatuses and methods have not been shown in detail so as not to obscure the description of various embodiments. Additionally, although the various embodiments focus on implementation within a NAND flash memory device, the techniques and methods presented herein are readily applicable to a number of other memory device types.

Figure 1:
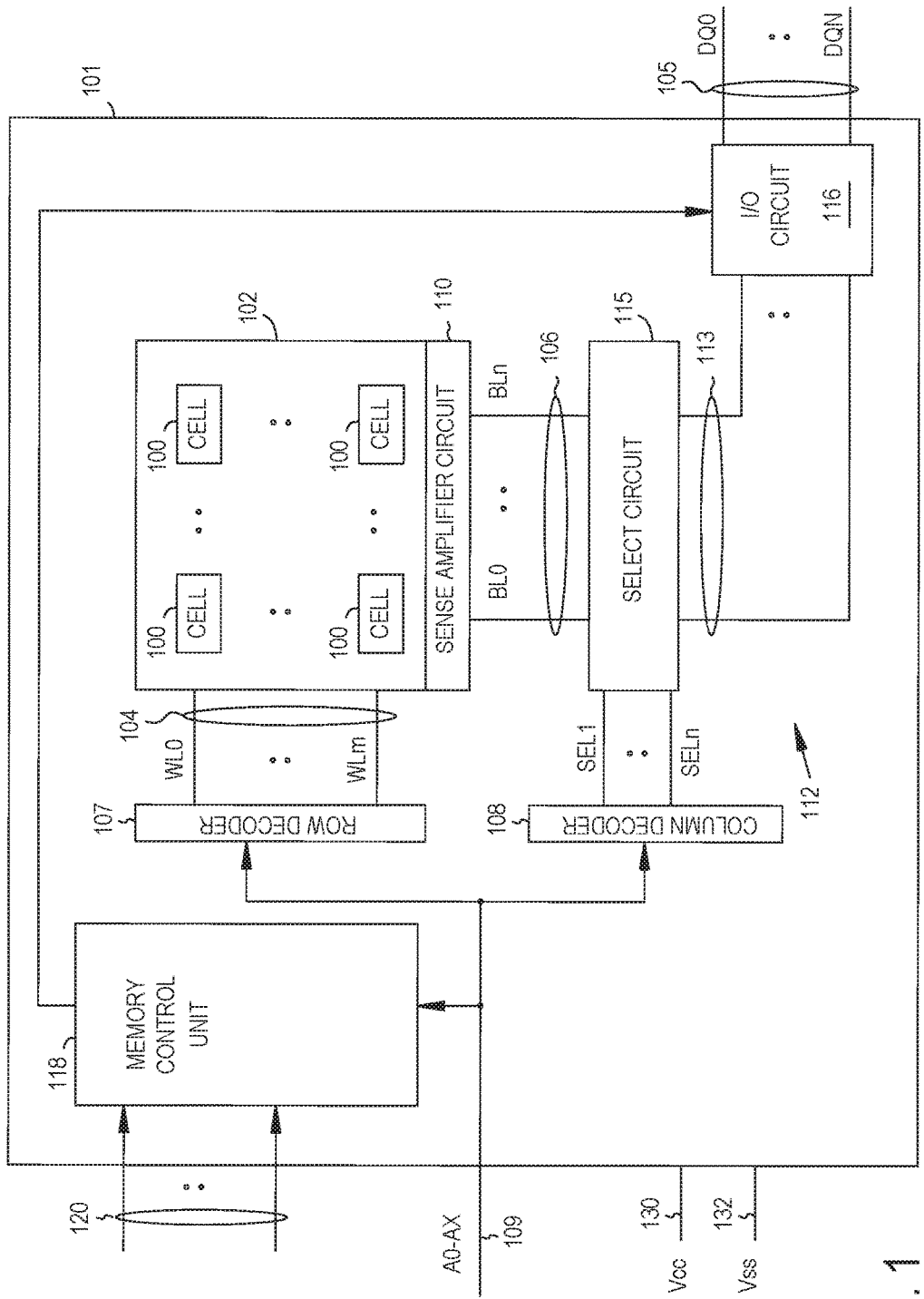
FIG. 1 shows a block diagram of a memory device having a memory array with memory cells, according to an embodiment.

Referring now to FIG. 1, a block diagram of an apparatus in the form of a memory device 101 is shown. The memory device 101 includes one or more memory arrays 102 having a number (e.g., one or more) of memory cells 100. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 can operate to decode address signals A0 through AX on address lines 109 to determine which ones of the memory cells 100 are to be accessed.

Sense circuitry, such as a sense amplifier circuit 110, operates to determine the values of information read from the memory cells 100 in the form of signals on the first data lines 106. The sense amplifier circuit 110 can also use the signals on the first data lines 106 to determine the values of information to be written to the memory cells 100.

The memory device 101 is further shown to include circuitry 112 to transfer values of information between the memory array 102 and input/output (I/O) lines 105. Signals DQ0 through DQN on the I/O lines 105 can represent values of information read from or to be written into the memory cells 100. The I/O lines 105 can include nodes of the memory device 101 (e.g., pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read values of information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations using signals from the control lines 120. Examples of the signals on the control lines 120 can include one or more clock signals and other signals to indicate which operation (e.g., a programming operation or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming, read, or erase command) that can cause the memory device 101 to perform a corresponding memory operation (e.g., a program, read, or erase operation).

Although various embodiments discussed herein use examples relating to a single-bit memory storage concept for ease in understanding, the inventive subject matter can be applied to numerous multiple-bit schemes as well. In some embodiments, each of the memory cells 100 can be programmed to a different one of at least two data states to represent, for example, a value of a fractional bit, the value of a single bit or the value of multiple bits such as two, three, four, or a higher number of bits.

For example, each of the memory cells 100 can be programmed to one of two data states to represent a binary value of "0" or "1" in a single bit. Such a cell is sometimes called a single-level cell (SLC).

In some embodiments, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to one of more than two data states is sometimes referred to as a multi-level cell (MLC). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the values of information to be read from or to be programmed into the memory cells 100. The column decoder 108 can selectively activate the SEL1 through SELn signals based on the A0 through AX address signals present on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device, and the memory cells 100 can include non-volatile memory cells, such that the memory cells 100 can retain information stored therein when power (e.g., $V_{cc}$, or $V_{ss}$, or both) is disconnected from the memory device 101.

Each of the memory cells 100 can include a memory element having material, at least a portion of which can be programmed to a desired data state (e.g., by being programmed to a corresponding charge storage state). Different data states can thus represent different values of information programmed into each of the memory cells 100.

The memory device 101 can perform a programming operation when it receives (e.g., from an external processor or a memory controller) a programming command and a value of information to be programmed into one or more selected ones of the memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not shown in the figure, so as not to obscure details of the various embodiments described. The memory device 101 may include devices and memory cells, and operate using memory operations (e.g., programming and erase operations) similar to or identical to those described below with reference to various other figures and embodiments discussed herein.

Figure 2:
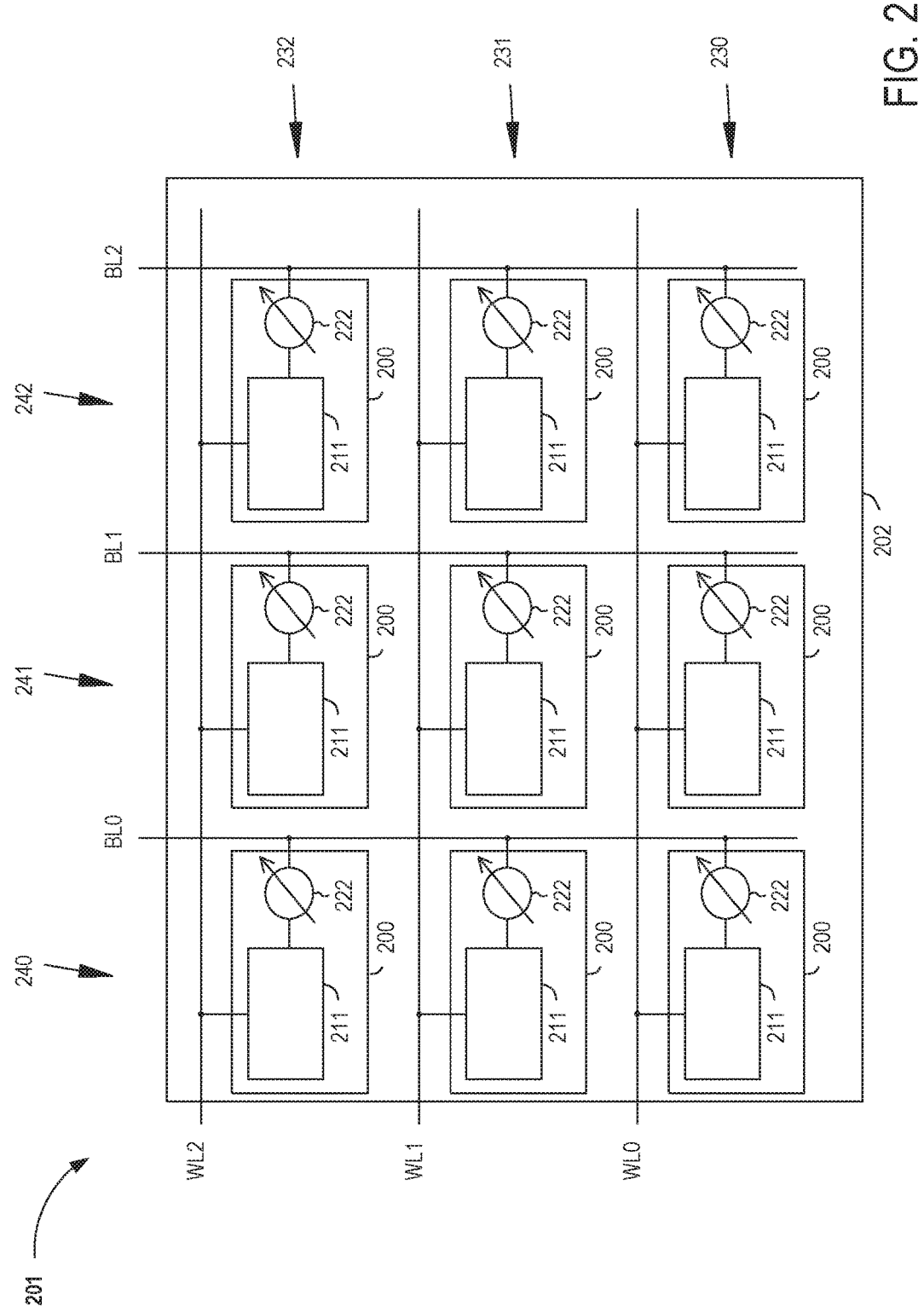
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar to or identical to the memory array 102 of FIG. 1. As further shown in FIG. 2, the memory cells 200 are shown to be arranged in a number of rows 230, 231, 232, along with access lines, for example word lines, to conduct signals to the memory cells 200, such as signals WL0, WL1, and WL2. The memory cells are also shown to be arranged in a number of columns 240, 241, 242 along with data lines, for example bit lines, to conduct signals to the cells 200, such as signals BL0, BL1, and BL2. The access components 211 can turn on (e.g., by using appropriate values of signals WL0, WL1, and WL2) to allow access to the memory elements 222, such as to operate the memory elements 222 as pass elements, or to read information from or program (e.g., write) information into the memory elements 222.

Programming information into the memory elements 222 can include causing the memory elements 222 to have specific resistance states. Thus, reading information from a memory cell 200 can include, for example, determining a resistance state of the memory element 222 in response to a specific voltage being applied to its access component 211. The act of determining resistance may involve sensing a current (or the absence of current) flowing through the memory cell 200 (e.g., by sensing a current of a data line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing the voltage on a data line electrically coupled to the memory cell.

Various ones or all of the memory cells 100, 200 of FIG. 1 and FIG. 2 can include a memory cell having a structure similar or identical to one or more of the memory cells and devices described below.

Figure 3:
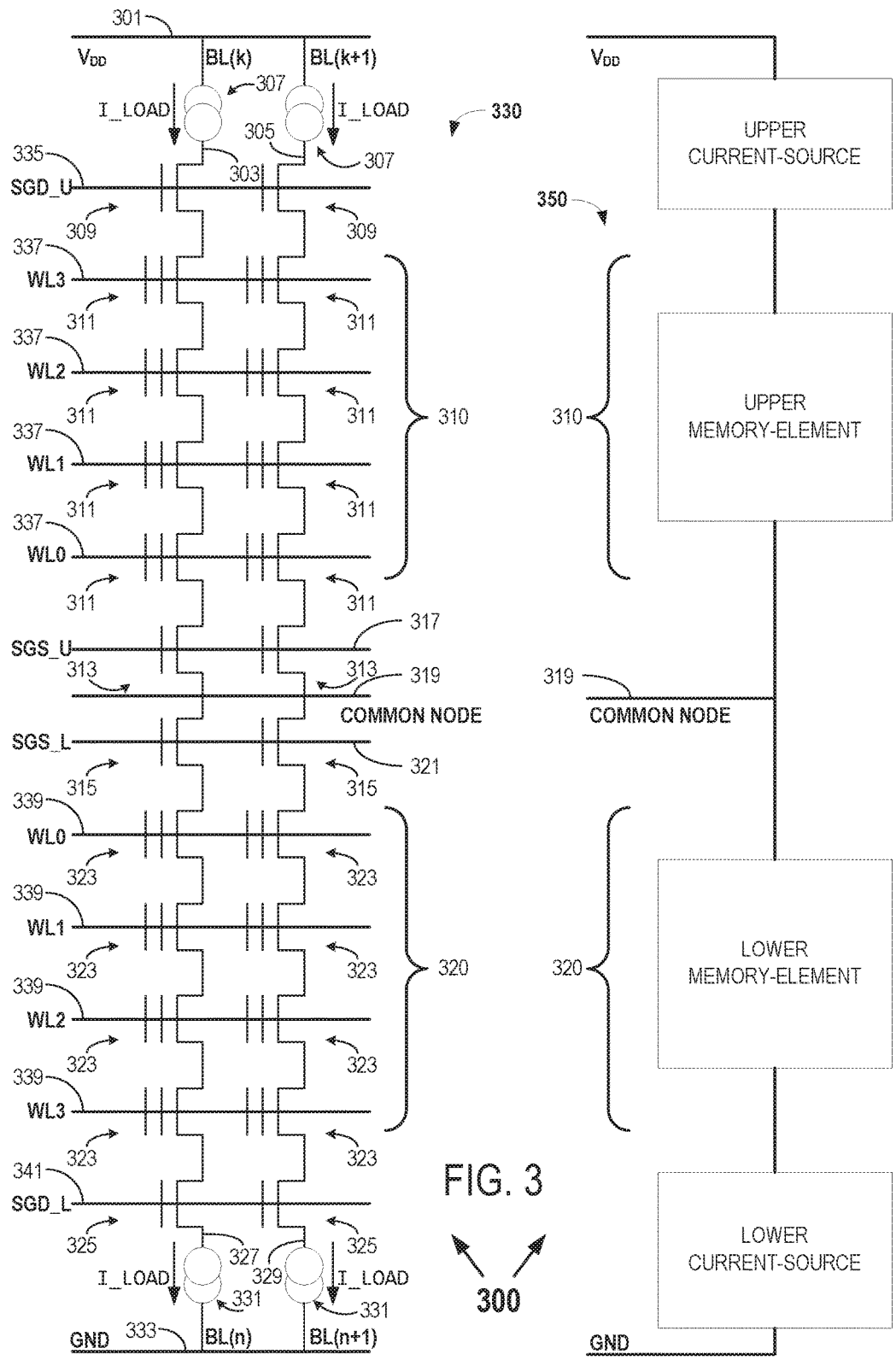
FIG. 3 shows a schematic circuit diagram and an associated block diagram of a portion of a memory array, according to an embodiment.

With reference now to FIG. 3, a schematic circuit diagram 330 and an associated block diagram 350 of a portion of a memory array 300 are shown. In comparison with contemporaneous memory devices that use a conventional voltage sensing technique to read the memory cells, the memory array 300 can use a current sensing technique during a read operation. Further, most contemporaneous memory devices have sense amplifiers coupled alternately to odd-strings and even strings to reduce cross-talk and capacitive coupling effects between adjacent memory strings due to their use of voltage sensing techniques. The current sensing techniques described herein allow each of the strings of memory to be coupled to a separate sense circuit. Thus, the current sensing technique enables concurrent parallel reading of all memory strings, thereby increasing read bandwidth.

The memory array 300 may correspond to a portion of the memory device 101 of FIG. 1. For example, the memory array 300 can form a part of the memory array 102 of FIG. 1. The memory array 300 can also include a control unit similar to or identical to the memory control unit 118 of FIG. 1 to control memory operations (e.g., read, write, and erase operations) of the memory array 300.

As shown in FIG. 3, the memory array 300 can include a conductive voltage line 301 coupled to a first supply node (e.g., Von) to supply power to upper current-sources 307. A left-side data line 303 (to carry a signal BL(k)) and a right-side data line 305 (to carry a signal BL(k+1)) can each be coupled to the respective upper current-sources 307 to provide current to upper strings 310 of memory cells 311. Although only two NAND strings are shown in FIG. 3, three or more NAND strings may be used. Further, the subject matter disclosed herein is not limited to NAND memory but may include, instead of or in addition to, memories such as phase change memory (PCM), resistive RAM (RRAM), conductive-bridging RAM (CBRAM), and other memory types.

SGD select transistors 309 may have their respective gates coupled to each other and may be controlled (e.g., turned on or turned off) by a signal SGD_U (e.g., a drain select-gate signal) on an upper SGD select-line 335 (e.g., a drain select line) of the memory array 300. During a memory operation (e.g., a read or write operation) of the memory array 300, the signal SGD_U can control whether current is provided to the upper strings 310 from the upper current-sources 307 (through a respective one of the data lines 303, 305).

The upper strings 310 include a number of memory cells 311 couplable to a respective one of the left-side data line 303 and the right-side data line 305 (through a respective one of the select transistors 309). Further, each of the memory cells 311 is coupled to a respective one of a number of access lines 337. The access lines 337 can each carry one of a signal WL0, WL1, WL2, and WL3 as indicated in FIG. 3. Only four memory cells 311 are depicted as being in each of the upper strings 310; however, a larger or a smaller number of the memory cells 311 may be used in each of the upper strings 310.

As shown, a common (e.g., source) node 319 may be coupled to the upper strings 310 by the operation of an upper SGS select-line 317 coupled to upper SGS select-transistors 313. The upper SGS select-transistors 313 can have their respective gates coupled to each other and may be controlled (e.g., turned on or turned off) by a signal SGS_U (e.g., a source select-gate signal) on the upper SGS select-line 317 (e.g., source select line) of the memory array 300.

With continuing reference to FIG. 3, a left-side data line 327 and a right-side data line 329 are each shown as being couplable to lower strings 320 of memory cells 323. The lower strings 320 include a number of the memory cells 323 couplable to a respective one of the left-side data line 327 and the right-side data line 329. Further, each of the memory cells 323 is coupled to a respective one of a number of access lines 339. The access lines 339 can each carry one of a signal WL0, WL1, WL2, and WL3 as further indicated in FIG. 3. The left-side data line 327 (to carry a signal BL(n)) and the right-side data line 329 (to carry a signal BL(n+1)) can each be coupled to a respective separate lower current-source 331 to provide current to the lower strings 320 of the memory cells 323.

The lower current-sources 331 can be coupled to a conductive line 333, which in turn may be coupled to a second supply node (e.g., $V_{SS}$). SGD select transistors 325 may have their respective gates coupled to each other and may be controlled (e.g., turned on or turned off) by a second signal SGD_L (e.g., a drain select-gate signal) on a lower SGD select line 341 (e.g., drain select line) of the memory array 300. During a memory operation (e.g., a read or write operation) of the memory array 300, the signal SGD_L can control whether current is provided from the lower current-sources 331 to the strings 320 (e.g., through a respective one of the data lines 327, 329). Memory operations, including read operations, are described in more detail with reference to FIG. 4, below.

As with the upper strings 310, the lower strings 320 are also depicted with only four memory cells 323 couplable to a respective one of the data lines 327, 329; however, a larger or a smaller number of the memory cells 323 may be used in the lower strings 320. Also, the number of memory cells 323 in the lower strings 320 may be different from the number of memory cells 311 in the upper strings 310.

As shown in FIG. 3, the common (e.g., source) node 319 may be coupled to the lower strings 320 by the operation of a lower SGS select-line 321 coupled to lower SGS select-transistors 315. The lower SGS select-transistors 315 may have their respective gates coupled to each other and may be controlled (e.g., turned on or turned off) by a signal SGS_L (e.g., a source select-gate signal) on the lower SGS select-line 321 (e.g., source select line) of the memory array 300.

Either or both of the upper SGS select-transistors 313 and the lower SGS select-transistor 315 may be activated on the memory array 300. Thus, as indicated by FIG. 3, when activated, the upper strings 310 and the lower strings 320 may be coupled in series to each other through the common node 319 (e.g., a conductive line or other conductive structure). The common node 319 may comprise, for example, a common source (e.g., a source line, source slot, or source diffusion region). As discussed in more detail below with reference to FIG. 5A and FIG. 5B, each of the data lines 303, 305, 327, 329 are coupled to a separate sense circuit. Thus the memory cells 311, 323 on both the left side strings and the right side strings may be operated on (e.g., read from) concurrently.

In an embodiment, the separate strings may be stacked in a three-dimensional memory device. Further, interconnect wiring within a physical memory array may be used to couple similar portions of the array together. For example, each of the access lines 337 coupled to the upper strings 310 may be coupled to respective ones of the access lines 339 coupled to the lower strings 320 through interconnect wiring. By electrically coupling the corresponding access lines 337, 339, a bias signal, for example, WL3, may be placed on each of the appropriate ones of the access lines substantially simultaneously.

As used herein, for example, with reference to FIG. 3, the terms "upper" and "lower," "right" and "left," "first," "second," "third," and "fourth" are simply to aid a person of ordinary skill in the art in understanding the subject matter with respect to the Figures. Thus, the terms "upper" and "lower" do not necessarily relate to any particular physical placement in an actual circuit. For example, in some embodiments, the memory cells 311, 323 in each memory element 310, 320 can be physically located in multiple levels of the memory array 300, such that the memory cells 311, 323 can be stacked over each other in multiple levels of the memory array 300. In some embodiments, the memory cells 311 of the upper strings 310 can be physically located in the a first number of levels (e.g., levels 4-7) and the memory cells 323 of the lower strings 320 can be physically located in a second number of levels (e.g., levels 0-3).

Figure 4:
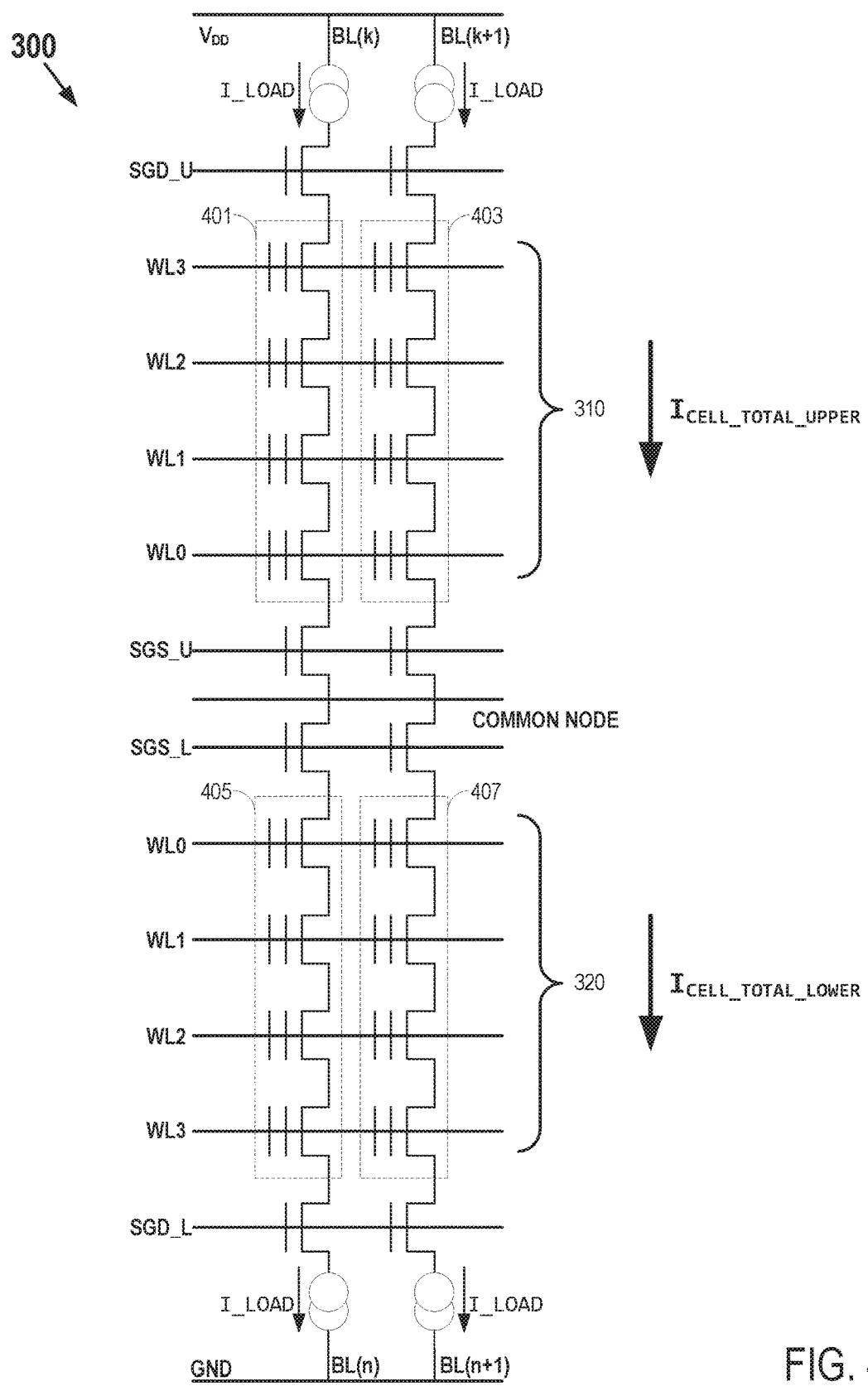
FIG. 4 indicates current flow for the schematic circuit diagram of FIG. 3, during a read operation of the memory array.

With reference now to FIG. 4, the schematic circuit diagram 330 of FIG. 3 is shown, with current flow indicated during a read operation of the memory array 300. Various ones of the element numbers of FIG. 3 have been omitted so as not to obscure the conceptualization of current flow during the read operation.

FIG. 4 shows a first memory-cell string 401 and a second memory-cell string 403 as upper strings 310, and a third memory-cell string 405 and a fourth memory-cell string 407 as lower strings 320. With concurrent reference to FIG. 3 and FIG. 4, the first memory-cell string 401 comprises memory cells 311 couplable to the left-side data line 303 and the second memory-cell string 403 comprises memory cells 311 couplable to the right-side data line 305; with both strings 401, 403 being located substantially parallel and adjacent to one another. The third memory-cell string 405 comprises memory cells 323 couplable to the left-side data line 327 and the fourth memory-cell string 407 comprises memory cells 323 couplable to the right-side data line 329, both strings 405, 407 being located substantially parallel and adjacent to one another.

During a read operation, both of the strings 401, 405 couplable to the left-side data lines 303, 327 can be conductive at the same time, and/or both of the strings 403, 407 couplable to the right-side data lines 307, 329 can be conductive at the same time. For ease of understanding the description of read operations that follow, one may assume that one or more of the memory cells 311, 323 in the first memory-cell string 401 and the third memory-cell string 405, both couplable to a respective one of the left-side data lines 303, 327, are to be read. It is noted that similar or identical operations can also be applied to one or more of the memory cells 311, 323 in the second memory-cell string 403 and the fourth memory-cell string 407, both couplable to a respective one of the right-side data lines 305, 329.

Thus, to begin a read operation for memory cells in the strings 401, 405, the select transistors 309, 313, 315, 325 are activated (e.g., turned on) and a read current I_LOAD is provided through the first and third memory-cell strings 401 and 405. For each memory cell 311, 323 to be read in strings 401, 405, one or more of the signals WL0, WL1, WL2, and WL3 are asserted on corresponding ones of the access lines 337, 339.

With continuing reference to FIG. 4, during a read operation, a current $I_{CELL\_TOTAL\_UPPER}$, flows through the first memory-cell string 401 and a current $I_{CELL\_TOTAL\_LOWER}$ flows through the third memory-cell string 405. As described in more detail below, during the read operation, the third memory-cell string 405 will receive at least a portion of the current flowing in the first memory-cell string 401.

As a first example, in a rare case (e.g., a degenerate case) where all memory cells 311, 323 are conductive (e.g., they all store a value of "1"), then substantially all of the current provided by I_LOAD flows through the first memory-cell string 401 and the third memory-cell string 405. For example, the total current, $I_{DD\_TOTAL}$, flowing through the memory-cell strings 401, 405 in this example may be described using the following equation:

$$I_{DD\_TOTAL} = I_{CELL\_TOTAL\_UPPER} + I_{CELL\_TOTAL\_UPPER}.$$

This somewhat degenerate case of having all memory cells 311, 323 being conductive (e.g., all storing a value of "1") presents the maximum total current flow, and consequently the highest energy usage, of the memory array 300. Thus, in this case, $I_{DD\_TOTAL}$ may be equal to or less than I_LOAD (e.g., the maximum current that can be sourced). This maximum current flow, in this degenerate case, is approximately the same current flow used by the previously discussed ABL technique for any read operation, regardless of a stored value of the individual memory cells.

However, in cases where the memory cells of the memory array 300 have stored a mixture of "0" values and "1" values, the total current, $I_{DD\_TOTAL}$, may be much less than the cumulative value of current flowing through each of the memory-cell strings 401, 405 separately. For example, if the values stored within the cells being read causes more current to flow through the first memory-cell string 401 than through the third memory-cell string 405, such that:

$$I_{CELL\_TOTAL\_UPPER} > I_{CELL\_TOTAL\_LOWER}; \text{ then}$$

$$I_{DD\_TOTAL} = I_{CELL\_TOTAL\_UPPER}.$$

In this case, the total current flow, $I_{DD\_TOTAL}$, is based on the current flow, $I_{CELL\_TOTAL\_UPPER}$, in the first memory-cell string 401 alone.

In another case however, where the values being read cause less current to flow through the first memory-cell string 401 than through the third memory-cell string 405:

$$I_{CELL\_TOTAL\_UPPER} < I_{CELL\_TOTAL\_LOWER}; \text{ and}$$

$$I_{DD\_TOTAL} = I_{CELL\_TOTAL\_LOWER}.$$

Consequently, the total current flow. $I_{DD\_TOTAL}$, is based on the current flow, $I_{CELL\_TOTAL\_LOWER}$, in the third memory-cell string 405 alone.

However, for reading stored data that are generally random in value, the total current flowing through each of the memory-cell strings 401, 405 may be approximately equal. That is:

$$I_{CELL\_TOTAL\_UPPER} \sim I_{CELL\_TOTAL\_LOWER}.$$

Thus, in the case of random data, where the total current flowing through each of the memory-cell strings 401, 405 is approximately equal, the total current flow, $I_{DD\_TOTAL}$ is approximately half the maximum total current flow where the stored data are all at a value of "1" as discussed above.

In a specific example, to further aid in understanding the energy savings possible with the disclosed subject matter, assume 75% of the memory cells 311 in the first memory-cell string 401 have a stored value of "1" Further assume that only 25% of the memory cells 323 in the third memory-cell string 405 have a stored value of "1" Therefore, the first memory-cell string 401 has three times as many memory cells with a "1" value as the third memory-cell string 405. If 750 µA flows through the first memory-cell string 401, then about one-third of that value (based on the ratio of "1" values stored in the first versus the third memory strings), or 250 µA flows through the third memory-cell string 405. The remaining 500 µA (e.g., the difference in current flow between the strings 401, 405) flows into the common node 319 (FIG. 3). In this example, since $I_{CELL\_TOTAL\_UPPER}$ is greater than $I_{CELL\_TOTAL\_LOWER}$; then $I_{DD\_TOTAL}$ equals $I_{CELL\_TOTAL\_UPPER}$. Consequently, $I_{DD\_TOTAL}$ equals 750 µA.

As discussed above, the ABL technique sources the total amount of current for every read operation. Using the examples from the scenario described above, the ABL technique would source the total current flowing through both strings (750 µA+250 µA) or 1 mA total, regardless of the data values stored in the memory cells. Thus, the ABL technique consumes 25% more energy in this example than does the disclosed subject matter. Similar savings may be achieved in other scenarios.

Figure 5A:
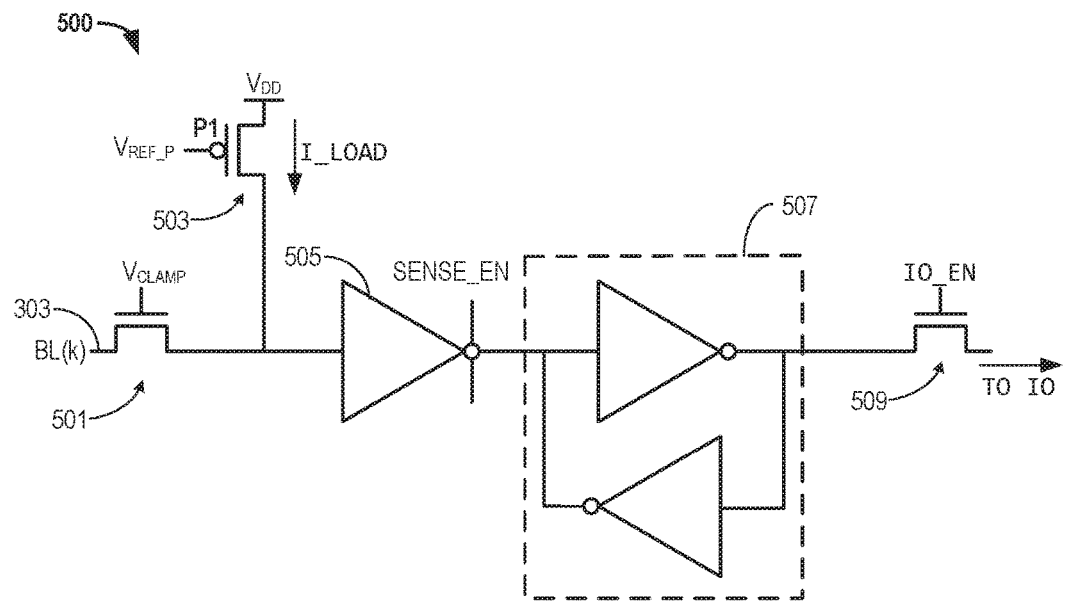
FIG. 5A and FIG. 5B show current source and sense amplifier arrangements that may be used with the schematic circuit of FIG. 3, according to an embodiment.
Figure 5B:
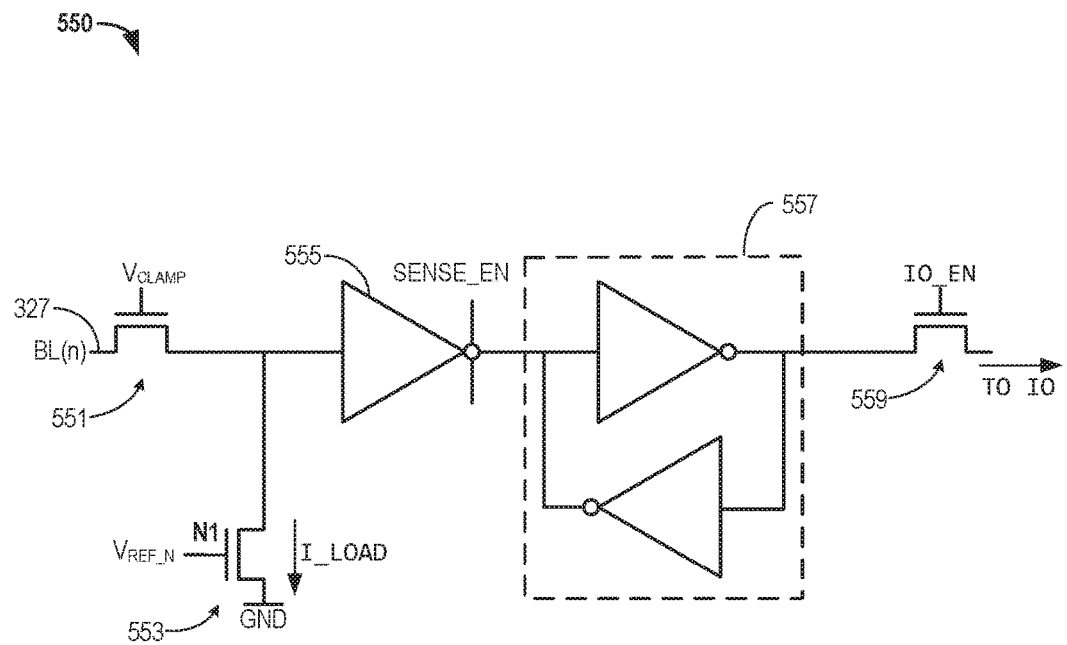

FIG. 5A and FIG. 5B show exemplary current source and sense amplifier arrangements that may be used with the memory array 300 of FIG. 3. An upper-circuit 500 may be used to source current to and sense the value of information stored in memory cells 311 of one of the upper strings 310 (e.g., one of the memory-cell strings 401 or 403). A lower circuit 550 may be used to source current to and sense the value of information stored in memory cells 323 in one of the lower strings 320 (e.g., one of memory-cell strings 405 or 407).

As shown, the upper circuit 500 includes a data enable element 501 coupled to, for example, the left-side data line 303, a power enable element 503, a sense amplifier 505, a data latch 507, and an input/output (I/O) enable element 509. The data enable element 501 clamps a data line (e.g., bit line) on which an operation is to be performed. The power enable element 503 may use a device activated (e.g., turned on) by a negative bias, $V_{REF\_P}$, being applied to the gate of the device. In a specific example, the power enable element 503 comprises a P-type metal-oxide semiconductor (PMOS) transistor.

A SENSE_EN signal activates the sense amplifier 505 for read operations. The sensed value is then temporarily stored in the data latch 507. As shown, the data latch 507 may comprise a pair of cross-coupled inverters and may be used to temporarily store write data and read data until written in from or read out to an I/O buffer (not shown) through the I/O enable element 509. In some embodiments, other types of data latches may be employed.

The lower circuit 550 is similar in some respects to the upper circuit 500 described above and includes a data enable element 551 coupled to, for example, the left-side data line 327, a power enable element 553, a sense amplifier 555, a data latch 557, and an I/O enable element 559. Except for the power enable element 503 in circuit 500 and the power enable element 553 in circuit 550, each of the elements in the lower circuit 550 may be similar or identical to the upper circuit 500.

The power enable element 553 may use a device activated (e.g., turned on) by a positive bias, $V_{REF\_N}$, being applied to the gate of the device. Therefore, the operation of the power enable element 553 may be considered to be complementary (e.g., activated by a bias voltage of the opposite polarity) to the operation of the power enable element 503. In a specific example, the power enable element 553 comprises an N-type metal-oxide semiconductor (NMOS) transistor. Additional embodiments may be realized.

Figure 6:
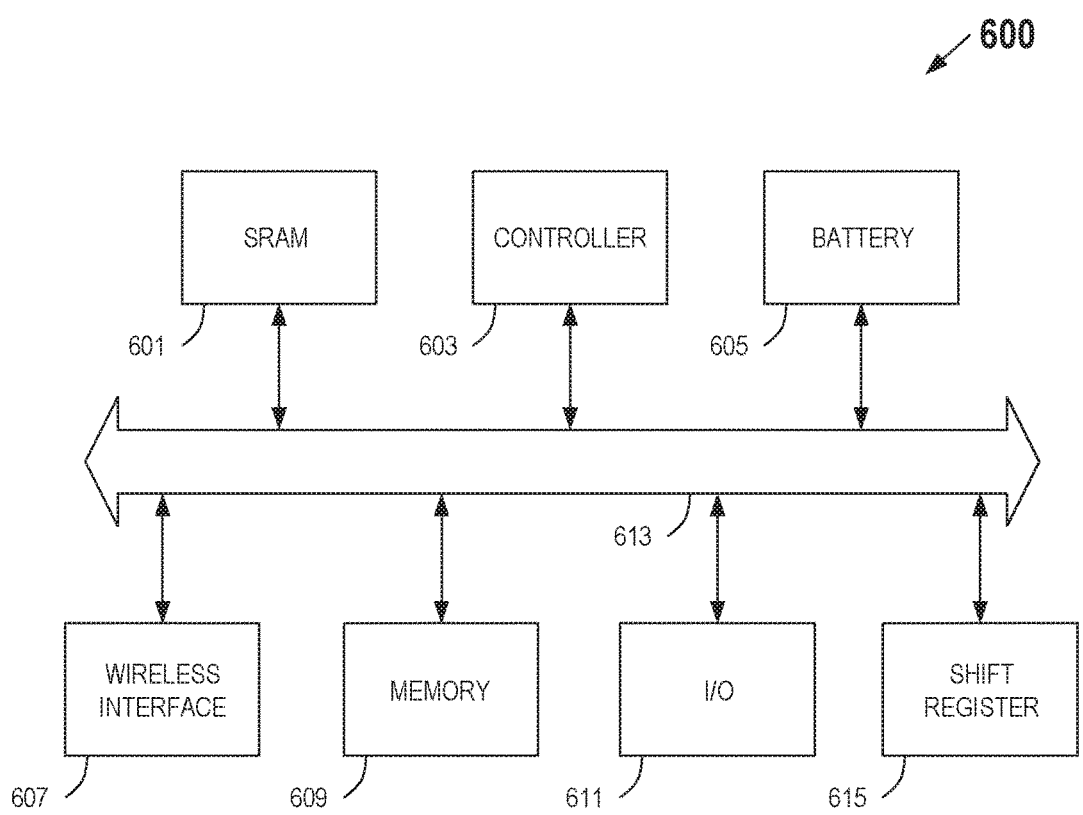
FIG. 6 shows a block diagram of a system embodiment, including a memory device according to various embodiments described herein.

For example, FIG. 6 is a block diagram of an apparatus in the form of a system 600 with a memory device 609 that may include one or more of the various embodiments described herein. The system 600 is shown to include a controller 603, an input/output (I/O) device 611 (e.g., a keypad, a touch-screen, or a display), a memory device 609, a wireless interface 607, a static random access memory (SRAM) device 601, and a shift register 615, each coupled to each other via a bus 613. A battery 605 may supply power to the system 600 in one embodiment. The memory device 609 may include a NAND memory, a flash memory, a NOR memory, a combination of these, or the like.

The controller 603 may include, for example, one or more microprocessors, digital signal processors, micro-controllers, or the like. The memory device 609 may be used to store information transmitted to or by the system 600. The memory device 609 may optionally also be used to store information in the form of instructions that are executed by the controller 603 during operation of the system 600 and may be used to store information in the form of user data either generated, collected, or received by the system 600 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 603 may include one or more of the novel devices and structures described herein.

The I/O device 611 may be used to generate information. The system 600 may use the wireless interface 607 to transmit and receive information to and from a wireless communication network with a radio frequency (RF) signal. Examples of the wireless interface 607 may include an antenna, or a wireless transceiver, such as a dipole antenna. However, the scope of the inventive subject matter is not limited in this respect. Also, the I/O device 611 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 611 may include one or more of the novel devices and structures described herein.

The various illustrations of the procedures and apparatuses are intended to provide a general understanding of the structure of various embodiments and are not intended to provide a complete description of all the elements and features of the apparatuses and methods that might make use of the structures, features, and materials described herein. Based upon a reading and understanding of the disclosed subject matter provided herein, a person of ordinary skill in the art can readily envision other combinations and permutations of the various embodiments. The additional combinations and permutations are all within a scope of the present invention.

The Abstract of the Disclosure is provided to comply with 37 C.F.R. § 1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus, comprising:
   a first string of memory cells; and
   a second string of memory cells being configured to be coupled to the first string of memory cells with a common node coupled between the first string and the second string, the second string of memory cells to receive at least a portion of current flowing in the first string of memory cells during a read operation, the common node configured such that data are not read out through the common node, the first string of memory cells and the second string of memory cells are each configured to be coupled to separate respective sense circuits during the read operation.

2. The apparatus of claim 1, wherein the common node coupled between the first string and the second string is configured to be coupled electrically to at least one of the first string of memory cells and the second string of memory cells.

3. The apparatus of claim 2, wherein the common node comprises a common source.

4. The apparatus of claim 2, wherein the common source is at least one type source from types of sources including a source line, a source slot, and a source diffusion region.

5. The apparatus of claim 2, wherein the apparatus is configured to couple electrically the second string to the first string through the common node during a read operation.

6. The apparatus of claim 2, further comprising:
   a first select transistor coupled to the first string of memory cells;
   a second select transistor coupled to the second string of memory cells;
   a third select transistor coupled between the first string of memory cells and the common node; and
   a fourth select transistor coupled between the second string of memory cells and the common node.

7. The apparatus of claim 1, wherein each of the memory cells comprise at least one type of memory selected from memory types including NAND memory, phase change memory (PCM), resistive RAM (RRAM), and conductive-bridging RAM (CBRAM).

8. The apparatus of claim 1, further comprising a separate current source coupled to each of the strings or memory cells.

9. A method of reading memory cells, the method comprising:
   coupling a first string of memory cells and a second string of memory cells in series with a common node coupled therebetween;
   coupling a first sense circuit and a second sense circuit to the first string of memory cells and the second first string of memory cells, respectively;
   providing a read current through the first string of memory cells and through the second string of memory cells substantially concurrently, the second string of memory cells receiving at least a portion of the read current flowing in the first string of memory cells during the read operation; and
   reading the first string of memory cells and the second string of memory cells substantially concurrently, the common node configured such that data are not read out through the common node.

10. The method of claim 9, further comprising activating a first select transistor and a second select transistor to couple the first string of memory cells and the second string of memory cells in series.

11. The method of claim 10, further comprising asserting a signal on one or more access lines coupled to the first string of memory cells and the second string of memory cells while each of the first select transistor and the second select transistor is activated.

12. The method of claim 9, further comprising coupling each of first multiple access lines in the first string of memory cells to respective ones of second multiple access lines in the second string of memory cells.

13. The method of claim 12, further comprising placing a bias signal on each of appropriate ones of the first multiple access lines and the second multiple access lines substantially simultaneously.

14. The method of claim 9, wherein, during reading with the read current through the first string of memory cells and through the second string of memory cells occurring substantially concurrently, with selected ones of the memory cells have a mixture of stored values of memory including values of both "1" and "0," a total current flow through the first string of memory cells and through the second string of memory cells is less than a cumulative current flow through each of the first string of memory cells and through the second string of memory cells separately.

15. An apparatus, comprising:
   a first string of memory cells coupled to a first current source, each of the memory cells of the first string is on a respective one of a first number of levels; and
   a second string of memory cells coupled to a second current source, each of the memory cells of the second string is on a respective one of a second number of levels, the second string of memory cells being configured to be coupled to the first string of memory cells with a common node coupled between the first string and the second string, the second string of memory cells to receive at least a portion of current flowing in the first string of memory cells during a read operation, the common node configured such that data are not read out through the common node, the first string of memory cells and the second string of memory cells are each to be coupled to a separate sense circuit.

16. The apparatus of claim 15, further comprising:
   a first select transistor coupled to the first string of memory cells;
   a first data line coupled to the first select transistor and the first current source, the first select transistor being configured to selectively couple current provided by the first current source to the first string of memory cells;
   a second select transistor coupled to the second string of memory cells; and
   a second data line coupled to the second select transistor and the second current source, the second select transistor being configured to selectively couple current provided by the second current source to the second string of memory cells.

17. The apparatus of claim 15, further comprising:
   a third string of memory cells; and
   a fourth string of memory cells, wherein a common node is coupled between the third string of memory cells and the fourth string of memory cells, the fourth string of memory cells being configured to receive at least a portion of a current flowing in the third string of memory cells during a read operation.

18. The apparatus of claim 17, wherein the apparatus is configured to couple the first string and the second string to each other in series during a concurrent read operation of the first string and the second string, and wherein the apparatus is configured to couple the third string and the fourth string to each other in series during a concurrent read operation of the third string and the fourth string.

* * * * *